PULSED TUNNEL DIODE MICROWAVE OSCILLATOR

Filed Nov. 29, 1967

INVENTOR
EDWARD J. GLEESON
BY William G. Christoforo
ATTORNEY 3,500,244

PULSED TUNNEL DIODE MICROWAVE OSCILLATOR

Edward J. Gleeson, York, Pa., assignor to The Bendix Corporation, York, Pa., a corporation of Delaware Filed Nov. 29, 1967, Ser. No. 686,518
Int. Cl. H03b *7/14;* H01p *3/08*
U.S. Cl. 331—107 6 Claims

ABSTRACT OF THE DISCLOSURE

A pulsed tunnel diode microwave oscillator without dropping or bias resistors for use with stripline circuits. A resonant line center strip is returned to ground through a ferrite toroid having several turns of wire to form a step-down transformer. The tunnel diode is connected between the resonant line and ground. Driving pulses delivered to the toroid transformer will cause the electrical oscillations to appear on the resonant line at its resonant frequency.

BACKGROUND OF THE INVENTION

Tunnel diode oscillators belong to the class of negative resistance oscillators which make use of the negative resistance portion of the tunnel diode's current-voltage characteristic curve. Normal practice in constructing a tunnel diode oscillator is to provide a tank circuit and a serially connected tunnel diode driven by a D.C. voltage source. The voltage source impedance must be low enough to hold the diode bias point in the negative resistance region of the diode current voltage characteristic curve. For example, in a tunnel diode oscillator where a 20 milliamp peak current tunnel diode has a characteristic curve slope of minus 10 ohms, the source impedance must be less than 10 ohms to hold the diode bias point in the desired region. The voltage across the diode will be quite low, typically in the order of 0.2 volt. To ensure the low source impedance, a dropping resistor is connected between the D.C. power source and the diode anode and a relatively low value bias resistor is connected between the diode anode and ground. As a result, power must be delivered, and dissipated, in the bias resistor as well as the rest of the oscillator circuit.

Transformers have been used with pulsed power sources to isolate the power supply from the oscillator tank circuitry; however, the secondary winding of the standard coupling transformer introduces an inductance into the oscillator circuit which limits the frequency obtainable.

SUMMARY OF THE INVENTION

Accordingly, a pulsed tunnel diode microwave oscillator has been devised which eliminates the need for dropping and bias resistors. Using stripline techniques, a resonant centerstrip is returned to ground through a ferrite toroid transformer, the path of the centerstrip through the toroid comprising a single turn secondary winding which thereby constitutes the frequency limiting inductance of the oscillator circuit. The tunnel diode is connected between the centerstrip and ground. A number of turns of wire about the toroid core comprise the transformer primary winding through which the oscillator driving pulses are applied to the circuit.

The oscillator output may be capacitively coupled off the centerstrip.

DESCRIPTION OF THE PREFERRED EMBODIMENT

Figure 1:
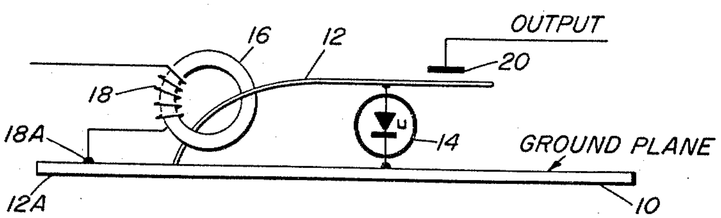
FIG. 1 is a diagrammatic representation of the invention.

Referring to FIG. 1, a diagrammatic view of the invention showing in stylized form the various elements of the oscillator, a ground plane 10 has one end 12A of conductor 12 soldered thereto. A ferrite toroid 16, having primary transformer winding 18, which is soldered at end 18A to ground plane 10, encircles conductor 12, which thereby comprises a secondary transformer winding. Tunnel diode 14 is fastened between conductor 12 and ground plane 10. Oscillator output is capacitively coupled from conductor 12 by adjustable output capacitor plate 20.

Figure 2:
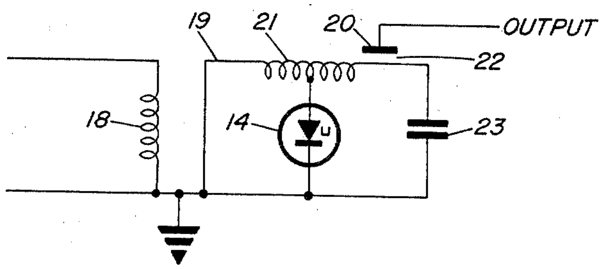
FIG. 2 is an equivalent circuit of the oscillator of FIG. 1.

The equivalent circuit for the device described above is shown in FIG. 2. Driving pulses are applied across primary winding 18 and are transformer coupled by the toroid transformer to the single loop 19 comprising the transformer secondary winding. The driving pulse is not critical as long as it is fast enough to maintain the amplitude of the output frequency essentially constant and is wide enough to excite the oscillator during several cycles of output frequency. The fact that the toroid transformer steps-down the voltage applied on the primary allows the use of high voltage, low current driving pulses. Reference numerals 21 and 23 represent the distributed inductance and capacitance, respectively, of the oscillator. The maximum frequency of this oscillator, of course, is limited by the internal resonant frequency of the tunnel diode and inductance loading represented by numerals 19 and 21 and the capacitive loading represented by numeral 23 and output coupling capacitor 22. The oscillator tank can be tuned over a rather broad range by varying the inductance 21 and capacitance 23 which can be achieved by adjusting the length of line 12 in FIG. 1 to vary the distributed inductance and capacitance.

Figure 3B:
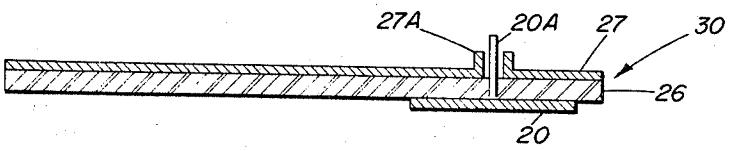
FIG. 3B is the output coupler used with FIG. 3A.
Figure 3C:
FIG. 3C is a disc of dielectric material used with the devices of FIGS. 3A and 3B.
Figure 3A:
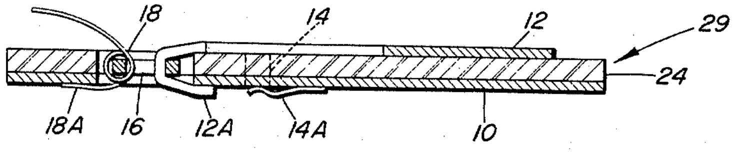
FIG. 3A is a specific embodiment of the invention without an output coupler.

Referring to FIG. 3A, which is a specific embodiment of the invention, ground plane 10 is seen to be a thin copper plate bonded or clad to the bottom of dielectric material 24. Similarly, conductor 12 is a C-shaped, thin copper strip bonded to the top of the dielectric except for free end 12A which bends through the center of toroid 16 to be soldered to ground plane 10. The toroid is housed in a recess in dielectric 24 and captured therein by conductor end 12A. Likewise, tunnel diode 14 is inserted in a hole through ground plane 10 and dielectric 24, but not through conductor 12. A spring clip 14A soldered at one end to ground plane 10 so as to be electrically integral therewith, contacts one side of the tunnel diode, captivating it and loading it against conductor 12. This type of diode mount is particularly adapted to the "pill-box" type diode package. The diode mounting can be easily altered to accept other types of diode packages.

Referring to FIG. 3B, output capacitor plate is seen to be a copper land bonded to a dielectric material 26, to which is bonded on its opposite side, a second ground plane 27. Oscillator output frequency is taken from the coaxial connector comprised of center conductor 20A which is connected to capacitor plate 20 and outer condutor 27A which is connected to ground plane 27. FIG. 3C is a thin sheet of dielectric material 28, suitably Mylar, which is sandwiched between the devices of FIGS. 3A and 3B when the oscillator is assembled so as to form the dielectric of coupling capacitor 22. Ground planes 10 and 27 form the sides of the oscillator cavity.

Figure 4A:
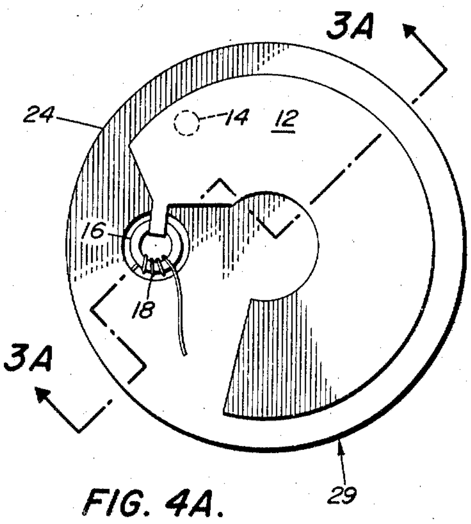
FIG. 4A is a plan view of FIG. 3A.
Figure 4B:
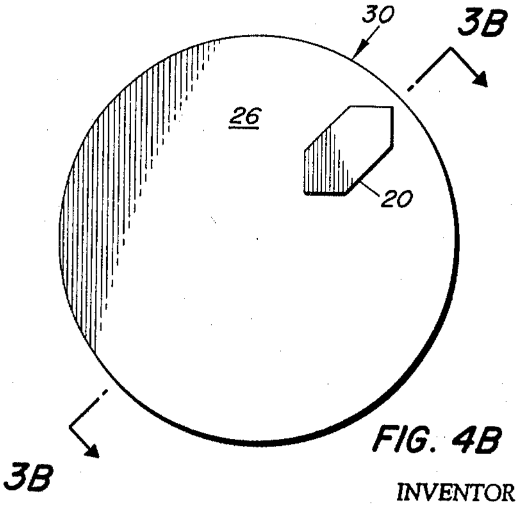
FIG. 4B is a plan view of FIG. 3B.

FIGS. 4A and 4B, which are plan views of FIGS. 3A and 3B respectively, show the oscillator to be mounted on two circular discs with conductor 12 laid circularly on dielectric 24 which comprises assembly 29. When the oscillator is assembled, that is, with assembly 30 placed over 29 with dielectric 28 sandwiched therebetween, the oscillator may be tuned to maximum power output by rotating assembly 30 so as to slide capacitor 20 along conductor 12 to adjust its length thereby varying the values of the distributed circuit elements. Frequency is primarily determined by the internal resonant frequency of the diode with the length of the resonant line adjusted to ¼ wavelength. In a practical device it was found that ½ milliwatt of peak output power could be obtained at a frequency of 1.0 gigahertz using a driving pulse of 15 nanosecond width at a 10 mHz. repetition rate The same technique can be used over the complete range of frequencies where the use of coaxial resonant lines is practical.

Certain alterations and modifications in the preferred embodiment of my invention will become apparent to one skilled in the art. Therefore, not wishing to limit my invention to the specific form shown, I hereby claim as my invention all the subject matter, including modifications and alterations thereof encompassed by the true scope and spirit of the appended claims.

The invention claimed is:

1. A pulsed tunnel diode oscillator comprising:
a toroid transformer having a primary winding;
a resonant conductor having a first end and a second end extending through said toroid;
a tunnel diode having first and second electrodes, said first electrode being attached to said conductor;
a ground plane having said second end of said conductor, said second electrode of said diode and one end of said primary winding attached thereto;
a moveable capacitor plate cooperating with said resonant conductor; and
conductor means connected to said capacitor plate for coupling the oscillator output therefrom.

2. An oscillator as recited in claim 1 wherein said resonant conductor line length is selected longitudinally along said resonant conductor whereby said oscillator output frequency is determined.

3. An oscillator as recited in claim 1 with additionally:
a first dielectric plate having a generally continuous conductive surface on one side comprising said ground plane and a conductive strip on the opposite side comprising said resonant conductor, one end of said strip being free and extending through said toroid and attached to said ground plane; and
a second dielectric plate having a generally continuous conductive surface on one side and a conductive plate on the opposite side comprising said capacitor plate, said first and second dielectric plates being arranged in spaced relationship with each other.

4. An oscillator as recited in claim 3 wherein said tunnel diode is mounted generally in said first dielectric plate.

5. An oscillator as recited in claim 3 wherein said second dielectric plate is adjustable longitudinally with respect to said resonant conductor whereby said capacitor plate is moved along said resonant conductor to vary the power coupled from said conductor.

6. An oscillator as recited in claim 5 wherein said conductive strip is C-shaped and said second dielectric plate is rotatable about its normal axis whereby said capacitor plate is made to follow a circular path along said conductive strip.

References Cited

UNITED STATES PATENTS

| | | | |
|---|---|---|---|
| 3,243,741 | 3/1966 | Bellman | 333—84 |
| 3,327,240 | 6/1967 | Grabowski | 331—107 |

OTHER REFERENCES

D. J. Carlson, RCA Tech. Note, No. 578, December 1964, pp. 307–322.

JOHN KOMINSKI, Primary Examiner

U.S. Cl. X.R.

307—322; 330—34, 53; 333—84